United States Patent
Iijima et al.

(10) Patent No.: US 6,716,796 B1
(45) Date of Patent: Apr. 6, 2004

(54) POLYCRYSTALLINE THIN FILM AND METHOD OF PRODUCING THE SAME AND OXIDE SUPERCONDUCTOR AND METHOD OF PRODUCING THE SAME

(75) Inventors: Yasuhiro Iijima, Tokyo (JP); Mariko Kimura, Tokyo (JP); Takashi Saito, Tokyo (JP)

(73) Assignees: Fujikura Ltd, Tokyo (JP); International Superconductivity, Tokyo (JP); Technology Center, The Juridical Foundation, Tokyo (JP)

(*) Notice: Subject to any disclaimer, the term of this patent is extended or adjusted under 35 U.S.C. 154(b) by 232 days.

(21) Appl. No.: 09/857,912

(22) PCT Filed: Oct. 18, 2000

(86) PCT No.: PCT/JP00/07213

§ 371 (c)(1),
(2), (4) Date: Jun. 11, 2001

(87) PCT Pub. No.: WO01/29293

PCT Pub. Date: Apr. 26, 2001

(30) Foreign Application Priority Data

Oct. 18, 1999 (JP) .............................. 11-295977

(51) Int. Cl.[7] .......................... H01B 12/00; H01F 6/00; H01L 39/80; B05D 5/12
(52) U.S. Cl. ...................... 505/238; 505/237; 427/62; 427/596; 427/126.3
(58) Field of Search .................. 505/230, 237, 505/238, 434, 470, 480; 427/62, 596, 126.3, 255.7, 419.3

(56) References Cited

U.S. PATENT DOCUMENTS

| 5,229,358 A | * | 7/1993 | Kumar ....................... 505/434 |
| 5,607,899 A | * | 3/1997 | Yoshida et al. .............. 505/474 |
| 5,650,378 A | * | 7/1997 | Iijima et al. ................ 505/473 |
| 6,214,772 B1 | * | 4/2001 | Iijima et al. ................ 505/475 |
| 6,256,521 B1 | * | 7/2001 | Lee et al. ................... 505/230 |
| 6,316,391 B1 | * | 11/2001 | Doi et al. .................... 505/236 |
| 6,337,991 B1 | * | 1/2002 | Li et al. ...................... 505/161 |
| 6,486,100 B1 | * | 11/2002 | Lee et al. .................... 505/470 |
| 6,495,008 B2 | * | 12/2002 | Iijima et al. ............ 204/298.09 |
| 2001/0006042 A1 | * | 7/2001 | Iijima et al. ................ 118/718 |

FOREIGN PATENT DOCUMENTS

| EP | 0 872 579 A1 | 10/1998 |
| JP | 10-231122 | 9/1998 |
| JP | 11-53967 | 2/1999 |
| JP | 11-053 967 A | 2/1999 |
| WO | WO98/17846 | 4/1998 |

* cited by examiner

Primary Examiner—Tom Dunn
Assistant Examiner—Colleen P. Cooke
(74) Attorney, Agent, or Firm—Bell, Boyd & Lloyd LLC

(57) ABSTRACT

A polycrystalline thin film B consisting mainly of oxide crystal grains 20 which have a crystal structure of a Type C rare earth oxide represented by one of the formulas $Y_2O_3$, $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$ formed on a film forming surface of a polycrystalline substrate A wherein grain boundary inclination angles between the corresponding crystal axes of different crystal grains in the polycrystalline thin film along a plane parallel to the film forming surface of the polycrystalline substrate are controlled within 30 degrees.

8 Claims, 11 Drawing Sheets

US 6,716,796 B1

POLYCRYSTALLINE THIN FILM AND METHOD OF PRODUCING THE SAME AND OXIDE SUPERCONDUCTOR AND METHOD OF PRODUCING THE SAME

TECHNICAL FIELD

The present invention relates to a polycrystalline thin film having a crystalline structure of a type C rare earth oxide with a well-aligned crystal orientation and a method of producing the same, and an oxide superconductor element of excellent superconducting properties having a polycrystalline thin film which has a crystalline structure of a type C rare earth oxide with a well-aligned crystal orientation and an oxide superconducting layer and a method of producing the same.

BACKGROUND ART

Oxide superconducting materials which have been discovered in recent years are good superconducting materials which have critical temperatures above the liquid nitrogen temperature. However, there remain various problems to be solved before oxide superconducting materials can be used as practical superconductors. One of the problems is the low critical current densities of oxide superconducting materials.

The problem that the critical current density of the oxide superconducting material is low stems mainly from the electrical anisotropy which is intrinsic to the crystals of the oxide superconducting material. It is known that the electric conductivity of oxide superconducting materials is high in the a-axis and b-axis directions of the crystal but is low in the c-axis direction. Thus, in order to use an oxide superconducting layer formed on a substrate as a superconductor element, it is necessary to form an oxide superconducting layer with a good crystal orientation on a substrate and to align the a-axis or b-axis of the crystal of the oxide superconducting material with the intended direction of current flow, while aligning the c-axis of the oxide superconducting material with the other direction.

Accordingly, such a practice has been employed wherein an intermediate layer having a good crystal orientation and made of MgO, $SrTiO_3$ or the like is formed on a substrate such as a metal tape by means of a sputtering apparatus, and an oxide superconducting layer is formed on the intermediate layer. However, the oxide superconducting layer formed on this type of intermediate layer by a sputtering apparatus has a critical current density (typically about 1,000 to 10,000 $A/cm^2$) which is far lower than that of the oxide superconducting layer (typically several hundred thousands of $A/cm^2$) which is formed on a single crystal substrate made of such a material. The cause of this problem is assumed to be as follows.

FIG. 14 is a sectional view of an oxide superconductor element made by forming an intermediate layer 2 on a substrate 1 made of a polycrystalline material in the form of a metal tape or the like by means of a sputtering apparatus, and then by forming an oxide superconducting layer 3 on the intermediate layer 2 by the sputtering apparatus. In the structure shown in FIG. 14, the oxide superconducting layer 3 is in a polycrystalline state in which a multitude of crystal grains 4 are bonded together in a random manner. These crystal grains 4 individually show the c-axis of each crystal being oriented perpendicular to the substrate surface, but the a-axis and b-axis are randomly oriented.

When the a-axes and b-axes are randomly oriented among the crystal grains of the oxide superconducting layer, degradation in the superconducting properties, particularly in the critical current density, would be caused since quantum coupling of the superconducting state is lost in the grain boundaries in which the crystal orientation is disturbed.

The cause of the oxide superconductor element turning into a polycrystalline state with the a-axes and b-axes randomly oriented is assumed to be as follows: since the intermediate layer 2 formed below the oxide superconductor element is polycrystalline in which the a-axes and b-axes are randomly oriented, the oxide superconducting layer 3 would be grown in such a condition so as to match the crystal structure of the intermediate layer 2.

The present inventors have found that an oxide superconductor element having a sufficient critical current density can be produced by forming an intermediate layer of YSZ (yttrium-stabilized zirconia), which has a well-oriented a-axis and b-axis, on a polycrystalline substrate by means of a special process, and by forming an oxide superconducting layer on the intermediate layer. With respect to this technology, the present inventors have filed applications by way of Japanese Unexamined Patent Application, First Publication No. Hei 4-293464, Japanese Patent Application, First Publication No. Hei 8-214806, Japanese Unexamined Patent Application, First Publication No. Hei 8-272606, and Japanese Unexamined Patent Application, First Publication No. Hei 8-272607.

The technology proposed in these patent applications makes it possible, when a film is formed on a polycrystalline substrate using a target made of YSZ, to selectively remove YSZ crystals of an unfavorable crystal orientation by means of an ion beam-assisted process in which the film forming surface of the polycrystalline substrate is irradiated in an oblique direction with a beam of ions, such as $Ar^+$, thereby selectively depositing YSZ crystals of a good crystal orientation, so that an intermediate layer of YSZ crystals having a good crystal orientation is formed.

According to the technology proposed in the previous applications of the present inventors, a polycrystalline thin film of YSZ with the a-axes and b-axes being favorably oriented can be made. It was also verified that the oxide superconducting material formed on the polycrystalline thin film has a sufficient critical current density, and the present inventors began research into developing technology of producing better polycrystalline thin films from other materials.

FIG. 15 is a sectional view showing an example of the oxide superconductor element which the inventors have been using recently. An oxide superconductor element D of this example has a four-layer structure made by forming, with the technology described previously, an orientation control intermediate layer 6 of YSZ or MgO on a substrate 5 in the form of a metal tape, then forming a reaction stopper intermediate layer 7 made of $Y_2O_3$ thereon, and forming an oxide superconducting layer 8 thereon.

The reason for using the four-layer structure is that, in order to make an oxide superconducting layer having a composition of $Y_1Ba_2Cu_3O_{7-x}$, it is necessary to apply a heat treatment at a temperature of several hundred degrees centigrade after forming the oxide superconducting layer having the desired composition by sputtering or another film forming process, but diffusion of the elements may proceed between the oxide superconducting layers having the compositions of YSZ and $Y_1Ba_2Cu_3O_{7-x}$, due to the heat supplied during the heat treatment; the diffusion may cause deterioration of the superconducting properties and must be prevented. The YSZ crystals which constitute the orientation control intermediate layer 6 have a cubic crystal structure, and the oxide superconducting layer having a composition of $Y_1Ba_2Cu_3O_{7-x}$ has a crystal structure called perovskite. Both of these crystal structures belong to a class of face-centered cubic crystals and have similar crystal lattices, but there exists a difference of about 5% in the lattice size between the two structures. For example, the distance between the nearest atoms, namely the distance between an atom located at a corner of the cubic lattice and an atom located at the center of the face of the cubic lattice, is 3.63 Å (0.363 nm) for YSZ, 3.75 Å (0.375 nm) for $Y_2O_3$, and 3.81 Å (0.381 nm) for an oxide superconducting layer having the composition of $Y_1Ba_2Cu_3O_{7-x}$. Thus, $Y_2O_3$ has an intermediate value between those of YSZ and $Y_1Ba_2Cu_3O_{7-x}$ and is useful for bridging the difference in lattice size and can be advantageously used as a reaction stopper layer due to the similarity of the compositions.

With the four-layer structure shown in FIG. 15, however, the number of required layers increases which leads to a problem of increasing the number of production processes.

In order to form a reaction stopper intermediate layer 7 of favorably oriented $Y_2O_3$ crystals directly on the metal tape substrate 5, the present inventors tried to form the reaction stopper intermediate layer 7 of $Y_2O_3$ on the substrate 5 by applying ion beam-assisted technology for which they had previously filed a patent application. However, the reaction stopper intermediate layer 7 of favorably oriented $Y_2O_3$ crystals could not be formed under the film growing conditions of conventional ion beam-assisted technology.

Meanwhile, techniques to form various films of a good orientation on polycrystalline substrates have been used in fields other than the application of oxide superconducting materials, such as thin optical films, magneto-optical disks, circuit wiring boards, high-frequency waveguides, high-frequency filters and cavity resonators. In any of these fields, it remains a challenge to form a favorably oriented polycrystalline thin film of stable film quality on a substrate. A polycrystalline thin film having a satisfactory crystal orientation would make it possible to improve the quality of optical thin films, magnetic films or thin films for circuit wiring to be formed thereon. It will be more preferable to be capable of forming thin optical films, thin magnetic films or thin films for circuit wiring, which have a satisfactory crystal orientation, directly on the substrate.

DISCLOSURE OF THE INVENTION

The present invention has been made to solve the problems described above, and has been completed after intensively studying the methods to form a polycrystalline layer of a type C rare earth oxide, such as $Y_2O_3$, having a favorable crystal orientation on a substrate by applying ion beam-assisted technology for which the present inventors had previously filed a patent application. An object of the present invention is to provide a polycrystalline thin film comprising crystal grains of a type C rare earth oxide having a favorable crystal orientation which makes it possible to align the c-axes of the oxide crystal grains of the type C rare earth oxide with a direction perpendicular to the substrate surface whereon the thin film is to be formed, and to align the a-axes and b-axes of the crystal grains of the type C rare earth oxide with a plane parallel to the film forming surface of the substrate. Another object of the present invention is to provide an oxide superconductor element which has a polycrystalline thin film comprising crystal grains of a type C rare earth oxide having a favorable crystal orientation, and an oxide superconducting layer having a favorable crystal orientation.

In order to achieve the objects described above, the polycrystalline thin film of the present invention consists mainly of oxide crystal grains which have a crystal structure of a type C rare earth oxide represented by one of the formulas $Y_2O_3$, $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$, formed on the film forming surface of a polycrystalline substrate wherein the grain boundary inclination angles (the grain boundary misalignment angle) between the same crystal axes of different crystal grains in the polycrystalline thin film along the plane parallel to the film forming surface of the polycrystalline substrate are controlled within 30 degrees.

In the constitution described above, the polycrystalline substrate can be formed from a heat resistant metal tape made of an Ni alloy, and the polycrystalline thin film can be formed from $Y_2O_3$.

In order to achieve the objects described above, the present invention provides a method of producing a polycrystalline thin film comprising oxide crystal grains which have a crystal structure of a type C rare earth oxide represented by one of the formulas $Y_2O_3$, $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$, being formed on the polycrystalline substrate surface whereon the thin film is to be formed, with the grain boundary inclination angles (the grain boundary misalignment angle) between the same crystal axes of different crystal grains along the plane parallel to the surface of the polycrystalline substrate whereon the film is to be formed being controlled within 30 degrees, wherein the polycrystalline substrate is set to a temperature in a range from 200 to 400° C. and an ion beam of $Kr^+$ or $Xe^+$ ions or a combination of these ions is generated from an ion source with the energy of the ion beam being set in a range from 100 eV to 300 eV, while the incident angle of the ion beam irradiating the substrate is set in a range from 50 to 60 degrees when depositing the particles generated from the target, which is made of the same elements as those of the polycrystalline thin film, onto the polycrystalline substrate.

In order to achieve the objects described above, the oxide superconductor element of the present invention comprises a polycrystalline substrate, a polycrystalline thin film formed on the polycrystalline substrate surface, and an oxide superconducting layer formed on the polycrystalline thin film, with the polycrystalline thin film consisting of oxide crystal grains which have a crystal structure of a type C rare earth oxide represented by one of the formulas $Y_2O_3$, $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$, wherein the grain boundary inclination angles between the same crystal axes of different crystal grains along the plane parallel to the film forming surface of the polycrystalline substrate are controlled within 30 degrees.

In order to achieve the objects described above, the present invention provides a method of producing an oxide superconductor element which comprises a polycrystalline substrate, a polycrystalline thin film formed on the polycrystalline substrate surface, and an oxide superconducting layer formed on the polycrystalline thin film, with the polycrystalline thin film consisting of oxide crystal grains which have a crystal structure of a type C rare earth oxide represented by one of the formulas $Y_2O_3$, $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$, with the grain boundary inclination angles between the same crystal axes of different crystal grains along the plane parallel to the surface of the polycrystalline substrate whereon the film is to be formed being controlled within 30 degrees, wherein the polycrystalline substrate is set to a temperature in a range from 200 to 400° C. and an ion beam of $Kr^+$ or $Xe^+$ ions or a combination of these ions is generated from an ion source with the energy of the ion beam being set in a range from 100 eV to 300 eV, while the incident angle of the ion beam irradiating the film forming surface of the substrate is set in a range from 50 to 60 degrees when depositing the particles generated from the target, which is made of the same elements as those of the polycrystalline thin film, onto the polycrystalline substrate, and then the oxide superconducting layer is formed on the polycrystalline thin film.

The polycrystalline thin film of a type C rare earth oxide, such as $Y_2O_3$, formed on the polycrystalline substrate is considered to be more advantageous than the conventional polycrystalline thin film of YSZ in many respects when a superconducting layer made of an oxide is formed thereon.

First, the lattice constant of $ZrO_2$ which is the main component of the YSZ crystal is 5.14 Å (0.514 nm) and assuming that the distance between an atom located at the center of a face of the unit cell and an atom located at a corner of the unit cell (the distance between nearest atoms) in the face-centered cubic lattice of $ZrO_2$ is 3.63 Å (0.363 nm), then the lattice constant of the $Y_2O_3$ crystal is 5.3 Å (0.53 nm) and the distance between the nearest atoms is 3.75 Å (0.375 nm). Taking into account the fact that the distance between the nearest atoms of an oxide superconducting material having the composition of $Y_1Ba_2Cu_3O_{7-x}$ is 3.9 Å (0.39 nm) and that the lattice constant is from 5.4 to 5.5 Å (0.54 to 0.55 nm) which is $2^{1/2}$ (the square root of 2) times the size of 3.9 Å (0.39 nm), the polycrystalline thin film of $Y_2O_3$ is considered to be more advantageous with respect to crystal matching than the polycrystalline thin film of YSZ. That is, when depositing the atoms of the polycrystalline thin film by the ion beam-assisted process, normal depositing of the atoms would be more easily achieved by using a material having a smaller value of the distance between the nearest atoms. Also, because $Y_2O_3$ has the crystal structure of a type C rare earth oxide, a material having a crystal structure of a type C rare earth oxide represented by one of the formulas $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$, can be used.

The research conducted by the present inventors shows that $BaZrO_3$ is likely to be generated by thermal diffusion, due to heating during the production process or a heat treatment, in the interface between the polycrystalline thin film of YSZ and the oxide superconducting layer of $Y_1Ba_2Cu_3O_{7-x}$, while the interface between the polycrystalline thin film of $Y_2O_3$ and the oxide superconducting layer of $Y_1Ba_2Cu_3O_{7-x}$ is stable under conditions of heating to a temperature from about 700 to 800° C., and therefore, a polycrystalline thin film of $Y_2O_3$ is also promising in this regard.

According to the present invention, the polycrystalline thin film comprising crystal grains of a type C rare earth oxide such as $Y_2O_3$, which has a favorable crystal orientation and is formed on the polycrystalline substrate with the grain boundary inclination angles(the grain boundary misalignment angle) being controlled within 30 degrees, can be preferably used as a base for forming various thin films thereon, and makes it possible to achieve good superconductive properties for the case when the thin film to be formed is a superconductive layer, can achieve good optical properties for the case when the thin film to be formed is an optical film, can achieve good magnetic properties for the case when the thin film to be formed is a magnetic film, and can obtain a thin film of lower wiring resistance and less defects for the case when the thin film to be formed is used for circuit wiring.

The oxide of a type C rare earth oxide used in the polycrystalline thin film may be an oxide represented by one of the formulas $Y_2O_3$, $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$.

A heat resistant metal tape made of an Ni alloy may be used as the polycrystalline substrate, and a metal tape carrying thereon the polycrystalline thin film comprising crystal grains of a type C rare earth oxide, such as $Y_2O_3$, can be made.

According to the present invention, since the substrate is controlled to a temperature in a range from 200 to 400° C., the energy of the ion beam is set in a range from 100 eV to 300 eV, and the incident angle of the ion beam irradiating the substrate is set in a range from 50 to 60 degrees from the normal direction of the film forming surface when depositing the particles generated from the $Y_2O_3$ target onto the polycrystalline substrate, it becomes possible to form the polycrystalline thin film of $Y_2O_3$ directly on the polycrystalline substrate with a good crystal orientation, which has been impossible in the prior art.

Since the polycrystalline thin film of $Y_2O_3$ can be formed directly on the polycrystalline substrate, it is not necessary to further laminate with a YSZ polycrystalline thin film, and the number of laminations required for forming a satisfactory film of a good crystal orientation on a polycrystalline substrate is reduced, thereby contributing to the simplification of the production process.

When the oxide superconducting layer is formed on the polycrystalline thin film of $Y_2O_3$, which has a good crystal orientation as described above, an oxide superconducting layer having a good crystal orientation can be formed, and therefore, an oxide superconducting layer having a high critical current density and a high critical current can be made. This is because the polycrystalline thin film of $Y_2O_3$ has better crystal matching characteristics with the oxide superconducting layer than the polycrystalline thin film of YSZ, thus making it possible to make an oxide superconducting layer having a better crystal orientation than in the case of using a polycrystalline thin film of YSZ.

Moreover, according to the present invention, since the polycrystalline thin film of $Y_2O_3$ can be formed directly on the polycrystalline substrate, the number of laminates constituting the oxide superconductor element can be reduced thereby simplifying the production process, in comparison with the prior art in which a double-layered film of YSZ and $Y_2O_3$ is used in consideration of the heat treatment which is carried out after forming the oxide superconducting layer.

Since it has been found from research conducted by the present inventors that $BaZrO_3$ is likely to be generated in the interface between the polycrystalline thin film of YSZ and the oxide superconducting layer of $Y_1Ba_2Cu_3O_{7-x}$ by thermal diffusion due to heat treatment or the like yet the interface between the polycrystalline thin film of $Y_2O_3$ and the oxide superconducting layer of $Y_1Ba_2Cu_3O_{7-x}$ is stable under the conditions of heating to a temperature from about 700 to 800° C., the polycrystalline thin film of $Y_2O_3$ is also advantageous in this regard and makes it possible to provide an oxide superconductor element which is less prone to the degradation of the superconducting properties even when subjected to a heat treatment after forming the oxide superconducting layer.

MODES FOR CARRYING OUT THE INVENTION

A preferred embodiment of the present invention will be described below with reference to the accompanying drawings.

Figure 1:
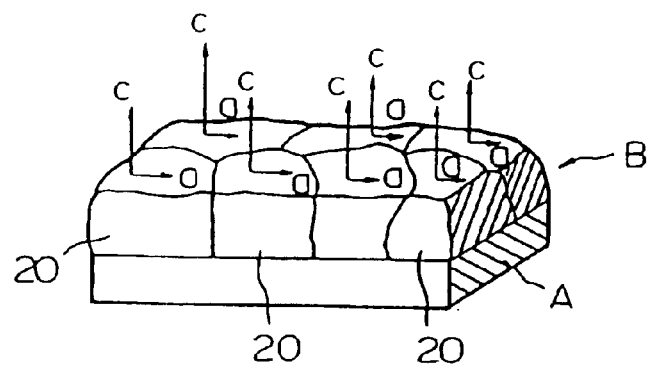
FIG. 1 is a partially cutaway perspective view of an example of a polycrystalline thin film formed by the method of the present invention.

FIG. 1 shows an embodiment in which the polycrystalline thin film of the present invention is formed on a substrate, where A indicates a polycrystalline substrate made in the form of a tape, and B indicates a polycrystalline thin film formed on the top surface of the polycrystalline substrate A.

The polycrystalline substrate A may be in various forms such as a sheet, a wire or a tape. The polycrystalline substrate A is made of a metal or an alloy such as silver, platinum, stainless steel, copper, Hastelloy or another Ni alloy, or a non-metallic material such as glass or ceramic.

The polycrystalline thin film B of this embodiment is formed from numerous fine crystal grains 20, made of $Y_2O_3$ which has a crystal structure of a type C rare earth oxide of an isometric system, bonded together at the grain boundaries, with the c-axis of each crystal grain 20 being aligned perpendicular to the top surface of the substrate A (the surface whereon the film is to be formed), while the a-axes, and also the b-axes, of the individual crystal grains 20 are oriented in the same direction and aligned in the substrate surface. The c-axis of each crystal grain 20 is also aligned perpendicular to the surface of the polycrystalline substrate A whereon the film is to be formed (top surface). The grains are bonded so that the angle (grain boundary inclination angle K shown in FIG. 2) between the a-axes (b-axes) of different crystal grains 20 is constrained within 30 degrees, for example, in a range from 25 to 30 degrees.

For the oxide which makes the crystal grains 20, oxides of a type C rare earth oxide, such as $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$ may be used as well as $Y_2O_3$.

Figure 3:
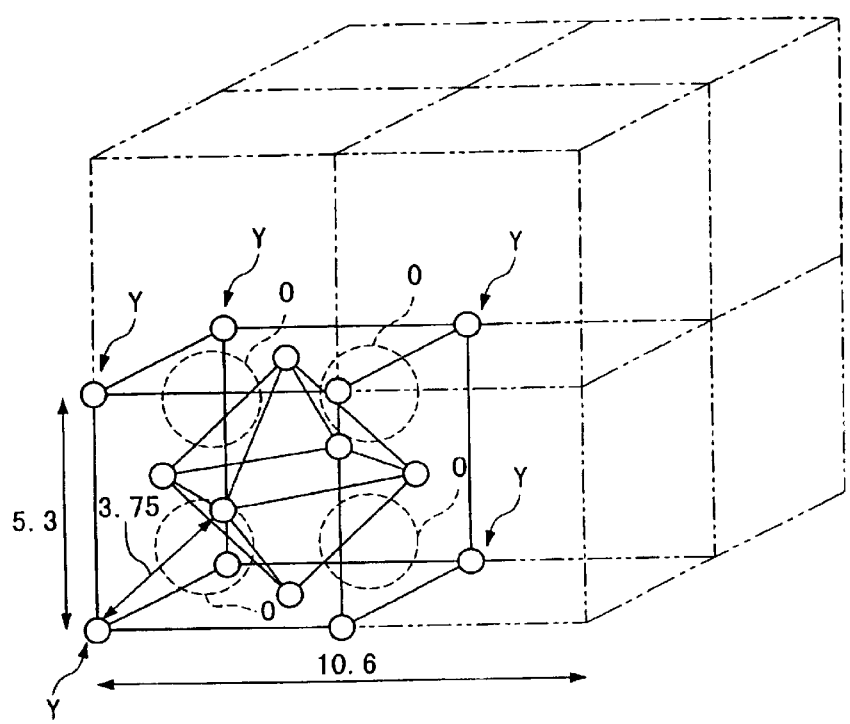
FIG. 3 is a schematic diagram showing the crystal lattice of a polycrystalline thin film of $Y_2O_3$.

While the crystal lattice of $Y_2O_3$ belongs to a type C rare earth oxide the type C rare earth oxide is derived from a fluorite structure of a cubic crystal system and has a structure such that, when eight unit cells of a face-centered cubic structure as shown in FIG. 3 are disposed on one another in the longitudinal and lateral directions, only one of the oxygen atoms which have been included interstitially between the lattices constituted from the Y atoms is removed. Therefore, a block of eight $Y_2O_3$ lattices stacked on one another is regarded as a unit cell in the field of X-ray analysis and therefore the lattice constant of the unit cell is 10.6, the width of the unit cell is 5.3 Å (0.53 nm), and the distance between the nearest atoms is 3.75 Å (0.375 nm).

When depositing crystals of $Y_2O_3$ by an ion beam-assisted process under conditions to be described later, an important factor is the distance between the nearest atoms being 3.75 Å (0.375 nm), and is preferably closer to the distance between the nearest atoms of 3.81 Å (0.381 nm) among the lattice constant 3.81 and the distance between the nearest atoms of 3.81 Å (0.381 nm) of the oxide superconducting layer having the composition of $Y_1Ba_2Cu_3O_{7-x}$. The difference in the distance between the nearest atoms from that of the oxide superconducting layer having the composition of $Y_1Ba_2Cu_3O_{7-x}$ is 1.5% for $Y_2O_3$, but is as large as 4.5% for YSZ which has a distance between the nearest atoms of 3.63 Å (0.363 nm).

Other oxides of the type C rare earth oxide which may also be used are: $Sc_2O_3$, of which the lattice constant is 9.84 and the distance between the nearest atoms is 3.48 Å (0.348 nm); $Nd_2O_3$, of which the lattice constant is 11.08 and the distance between the nearest atoms is 3.92 Å (0.392 nm); $Sm_2O_3$, of which the lattice constant is 10.972 and the distance between the nearest atoms is 3.86 Å (0.386 nm); $Eu_2O_3$, of which the lattice constant is 10.868 and the distance between the nearest atoms is 3.84 Å (0.384 nm); $Gd_2O_3$, of which the lattice constant is 10.813 and the distance between the nearest atoms is 3.82 Å (0.382 nm); $Tb_2O_3$, of which the lattice constant is 10.73 and the distance between the nearest atoms is 3.79 Å (0.379 nm): $Dy_2O_3$, of which the lattice constant is 10.665 and the distance between the nearest atoms is 3.77 Å (0.377 nm): $Ho_2O_3$, of which the lattice constant is 10.606 and the distance between the nearest atoms is 3.75 Å (0.375 nm); $Er_2O_3$, of which the lattice constant is 10.548 and the distance between the nearest atoms is 3.73 Å (0.373 nm); $Yb_2O_3$, of which the lattice constant is 10.4347 and the distance between the nearest atoms is 3.69 Å (0.369 nm); and $Lu_2O_3$, of which the lattice constant is 10.39 and the distance between the nearest atoms is 3.67 Å (0.367 nm).

An apparatus for and a method of producing the polycrystalline thin film B will be described below.

Figure 4:
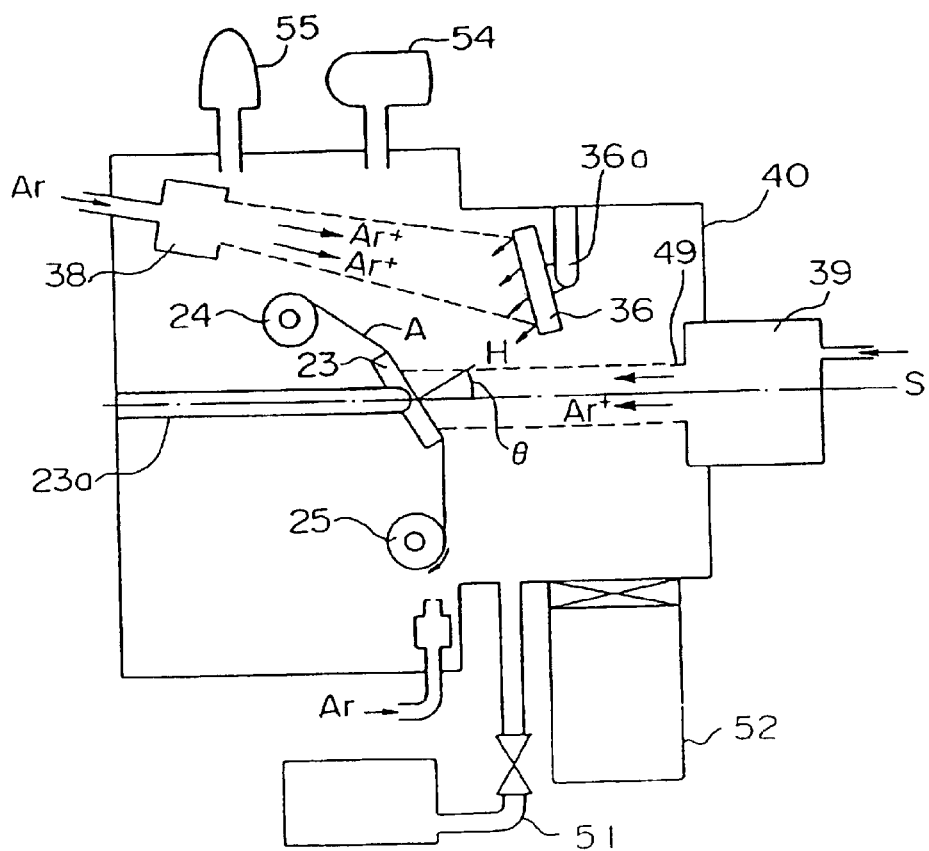
FIG. 4 is a schematic diagram showing an example of an apparatus for producing the polycrystalline thin film according to the present invention.

FIG. 4 shows an example of the apparatus for producing the polycrystalline thin film B, having a constitution such that an ion source for the ion beam assisting operation is provided on a sputtering apparatus.

The apparatus of this example comprises: a deposition vessel 40 in which a vacuum can be pumped and which contains a substrate holder 23 that can heat the polycrystalline substrate A in the form of a tape to a desired temperature while holding it; a substrate feeder reel 24 for feeding the polycrystalline substrate A onto the substrate holder 23; a substrate take-up reel 25 for winding the polycrystalline substrate A whereon the polycrystalline thin film has been formed; a target 36 in the form of a plate disposed at a distance obliquely above and opposite the substrate holder 23; a sputtering beam generation device 38 disposed obliquely above and facing the target 36; and an ion source 39 which is disposed at a distance to the side of and opposite the substrate holder 23 and at a distance from the target 36.

The substrate holder 23 has a heater installed therein, in order to heat the polycrystalline substrate A, in the form of a tape which has been fed onto the substrate holder 23, to a desired temperature as required. The substrate holder 23 is mounted on a support base 23a by means of a pin or the like so as to swivel freely, so that the angle of inclination thereof can be adjusted. The substrate holder 23 is disposed in an optimum irradiating area of the ion beam generated by the ion source 39 within the deposition vessel 40.

In this apparatus for producing the polycrystalline thin film, the substrate feeder reel 24 continuously feeds the polycrystalline substrate A in the form of a tape onto the substrate holder 23, and the substrate take-up reel 25 winds the polycrystalline substrate A whereon the polycrystalline thin film has been formed in the optimum irradiating area, thereby forming the polycrystalline thin film continuously on the polycrystalline substrate A. The substrate take-up reel 25 is disposed outside of the optimum irradiating area.

The target 36 is provided for the purpose of forming the desired polycrystalline thin film, and is made of a material of the same or similar composition as that of the polycrystalline thin film. Specifically, the target 36 is made of $CeO_2$. The target 36 is mounted on a target holder 36a which pivots by means of a pin or the like so as to swivel freely, while the angle of inclination thereof can be adjusted.

The sputtering beam generation device (sputtering means) 38 has a constitution such that an evaporation source is housed in a vessel and a grid is installed near the evaporation source for applying a voltage, so as to irradiate the target 36 with an ion beam for knocking particles off of the target 36 and directing the particles toward the polycrystalline substrate A.

The ion source 39 has a constitution substantially similar to that of the sputtering beam generation device 38, wherein any evaporation source is housed in a vessel and a grid is installed near the evaporation source for applying a voltage. A portion of the atoms or molecules evaporated from the evaporation source are ionized, and the ionized particles are controlled by the electric field generated by the grid thereby forming an ion beam. The particles may be ionized by various methods such as direct current discharge, radio frequency excitation, filament heating, and a cluster ion beam method. The filament heating method generates thermal electrons by the heat generated from flowing a current in a tungsten filament and causes the electrons to collide with the evaporated particles in a high vacuum, thereby ionizing the particles. With the cluster ion beam method, a cluster of molecules injected from a nozzle, provided in an aperture of a crucible which contains an evaporation source material, into a vacuum atmosphere is hit by thermal electrons so as to be ionized and radiated.

Figure 5A:
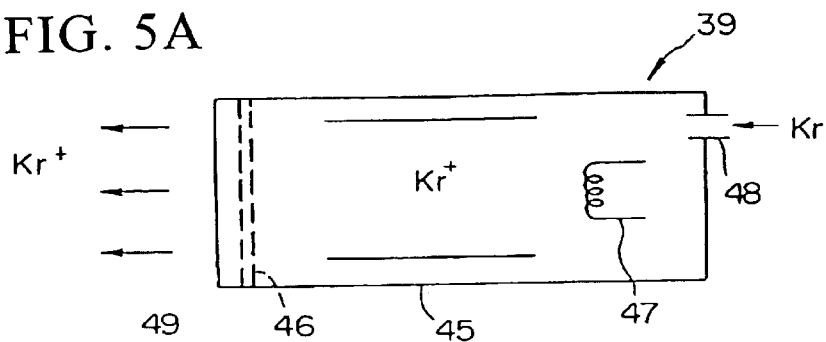
FIG. 5A is a schematic diagram showing an example of an ion source for the apparatus shown in FIG. 4.

In the polycrystalline thin film producing apparatus having a form such as described above, the ion source 39, having the internal constitution shown in FIG. 5A, is used. The ion source 39 comprises a cylindrical ionization chamber 45 which contains a grid 46, a filament 47, and an intake tube 48 for introducing gas such as Ar, Kr, or Xe, and is capable of emitting ions in a substantially parallel beam from a beam port 49 provided at the distal end of the ionization chamber 45.

The ion source 39 is arranged so that a center line S thereof is inclined at an incident angle θ (the angle between the normal direction of the film forming surface of the polycrystalline substrate A and the center line S) as shown in FIG. 4. The incident angle θ is preferably in a range from 50 to 60 degrees, more preferably in a range from 55 to 60 degrees, and most preferably around 55 degrees. Thus the ion source 39 is arranged to irradiate the film forming surface of the polycrystalline substrate A with the ion beam at an incident angle θ from a normal direction H. The present inventors previously filed a patent application for the incident angle of the ion beam.

For the ion beam applied by the ion source 39 to the polycrystalline substrate A, Ar gas, Kr gas or Xe gas, or a mixture of two or more selected from among the group of Ar gas, Kr gas, and Xe gas, for example, a mixed on beam of Ar gas and Kr gas, may be used.

The deposition vessel 40 is provided with a rotary pump 51 and a cryopump 52 for pumping the inside of the vessel 40 into a vacuum state, and an atmospheric gas source such as a gas bomb connected thereto, so that the evacuated Inner space of the deposition vessel 40 can be filled with an inert gas such as argon gas.

The deposition vessel 40 is further equipped with a current density measuring instrument for measuring the current density of the ion beam in the vessel 40 and a pressure gauge 55 for measuring the pressure in the vessel 40.

While the polycrystalline thin film producing apparatus of this example has an arrangement such that the substrate holder 23 is mounted on the support base 23a by means of a pin or the like so as to swivel freely and so that the angle of inclination thereof can be adjusted, the incident angle of the ion beam may also be adjusted by installing an angle adjustment mechanism on the support base of the ion source 39 thereby adjusting the inclination angle of the ton source 39. As a matter of course, there is no limitation to the angle adjustment mechanism, and various constitutions may be employed.

An operation will be described below for the case when the polycrystalline thin film B of $Y_2O_3$ is formed on the polycrystalline substrate A by using the apparatus of the constitution described above.

In order to form the polycrystalline thin film on the polycrystalline substrate A in the form of a tape, a target 36 made of $Y_2O_3$ is used; while the inner space of the deposition vessel 40 which houses the polycrystalline substrate A is pumped to a low pressure, the polycrystalline substrate A is fed from the substrate feeder reel 24 onto the substrate holder 23 at a predetermined speed, and the ion source 39 and the sputtering beam generation device 38 are operated.

When the target 36 is irradiated with the ion beam generated by the sputtering beam generation device 38, particles are knocked off of the target 36 and impinge on the polycrystalline substrate A. The particles which have been knocked off of the target 36 are then deposited on the polycrystalline substrate A which has been fed onto the substrate holder 23 and are, at the same time, irradiated with an ion beam of, for example, Kr⁺ ions or Xe⁺ ions, or a combined ion beam of Kr⁺ ions and Xe⁺ ions generated by the ion source 39, thereby forming a polycrystalline thin film of a desired thickness, while the polycrystalline substrate A in the form of a tape with the thin film formed thereon is wound on the substrate take-up reel 25.

The incident angle θ of the ion beam radiation is preferably in a range from 50 to 60 degrees, more preferably in a range from 55 to 60 degrees, and most preferably around 55 degrees. When θ is set to 90 degrees, the c-axis of the polycrystalline thin film cannot be oriented. When θ is set to 30 degrees, the c-axis orientation of the polycrystalline thin film cannot be achieved. When the ion beam is applied with an incident angle within the preferable range described above, the c-axis of the polycrystalline thin film of $Y_2O_3$ is oriented in the vertical direction. By sputtering with ion beam radiation at such an incident angle, the a-axes of different grains of the polycrystalline thin film of $Y_2O_3$ formed on the polycrystalline substrate A are aligned in the same direction and oriented in a plane which is parallel to the top surface (film forming surface) of the polycrystalline substrate A; the same occurs for the b-axes.

When forming the polycrystalline thin film B of a type C oxide rare earth element such as $Y_2O_3$, it is necessary to control the temperature of the polycrystalline substrate A and the energy of the assisting ion beam within proper ranges, in addition to controlling the incident angle of the assisting ion beam.

The temperature of the polycrystalline substrate A is preferably in a range from 200 to 400° C., more preferably in a range from 250 to 350° C., and most preferably 300° C.

The ion beam energy is preferably in a range from 100 to 300 eV, more preferably in a range from 125 to 175 eV, and most preferably 150 eV.

The polycrystalline thin film B of a type C rare earth oxide, such as $Y_2O_3$, can be formed with a good orientation only when formed on the polycrystalline substrate A by an ion beam-assisted process with the temperature and ion beam energy in these ranges.

Figure 2:
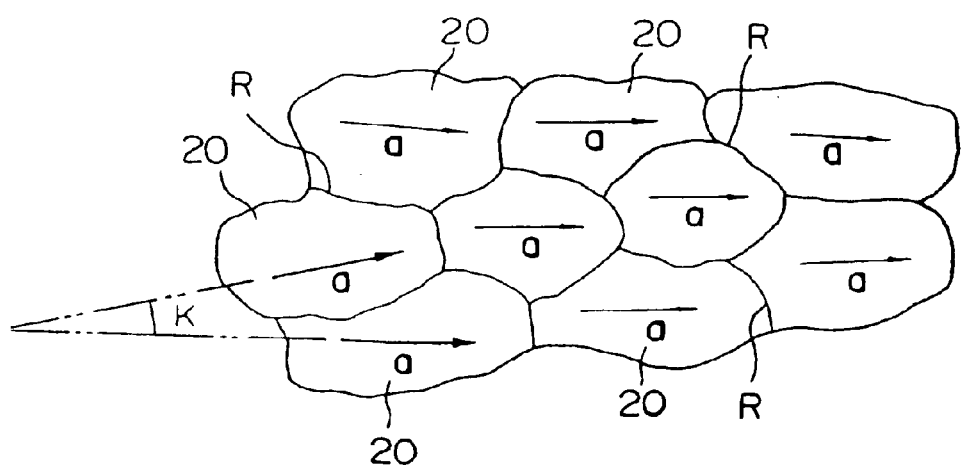
FIG. 2 is an enlarged plan view showing the crystal grains of the polycrystalline thin film shown in FIG. 1, the orientation of the crystal axes thereof, and the grain boundary inclination angle (the grain boundary misalignment angle).

FIG. 1 and FIG. 2 show the polycrystalline substrate A whereon the polycrystalline thin film B of $Y_2O_3$ is formed by the method described above. While FIG. 1 shows a case where only one layer of the crystal grains 20 is formed, the crystal grains 20 may also be deposited in a plurality of layers.

The present inventors assume that the cause of the crystal orientation of the polycrystalline thin film B being aligned is as follows.

Figure 5B:
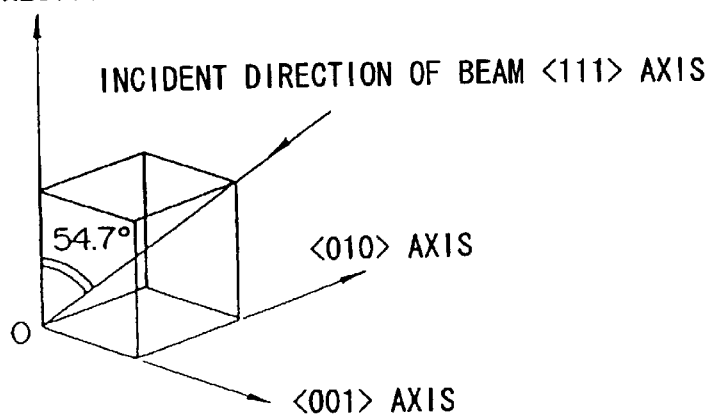
FIG. 5B is a diagram showing the incident angle of an ion beam.

The crystal lattice of the polycrystalline thin film B of $Y_2O_3$ has a type C rare earth oxide structure of a face-centered cubic system of an isometric crystal structure as shown in FIG. 5B, wherein the normal direction of the substrate lies on the <100> axis with the remaining <010> axis and <001> axis being aligned as shown in FIG. 5B. Studying the ion beam incident at an angle from the normal direction of the substrate with respect to these directions shows that the incident angle is 54.7 degrees when the beam is directed in the diagonal direction of the unit lattice passing the origin O in FIG. 5B, namely along the <111> direction. The reason that a good crystal orientation is obtained when the incident angle is In a range from 50 to 60 degrees as described above is assumed to be as follows. When the ion beam is incident at an angle of around 54.7 degrees, ion channeling occurs most effectively so that only atoms that are stabilized in an arrangement corresponding to that angle on the top surface of the polycrystalline substrate A are more likely to remain, while the other unstable atoms in a disturbed atom arrangement are sputtered by the ion beam and removed. As a result, only crystals constituted of well-oriented atoms can remain for deposition. It should be noted, however, that the ion beam sputtering effect accompanying the ion beam channeling can be effectively achieved with an ion beam of Ar⁺ ions, Kr⁺ ions or Xe⁺ ions, or a combined ion beam of Ar⁺ and Kr⁺ ions for the polycrystalline thin film of $Y_2O_3$.

Even when the polycrystalline thin film B of $Y_2O_3$ is formed under the conditions described above, a satisfactory ion beam channeling effect cannot be achieved unless the temperature of the polycrystalline substrate A during film forming and the ion beam energy during the ion beam-assisted process are set in the ranges described above. Therefore, it is necessary to control all of the three parameters of the incident angle of the ion beam, the temperature of the polycrystalline substrate A, and the ion beam energy within the proper ranges when forming the film.

Figure 6:
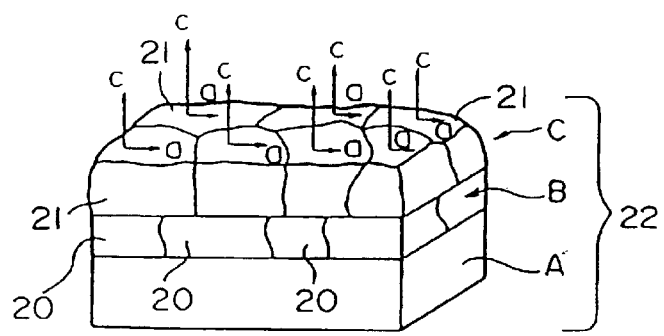
FIG. 6 is a schematic diagram showing an oxide superconducting layer formed on the polycrystalline thin film shown in FIG. 1.
Figure 7:
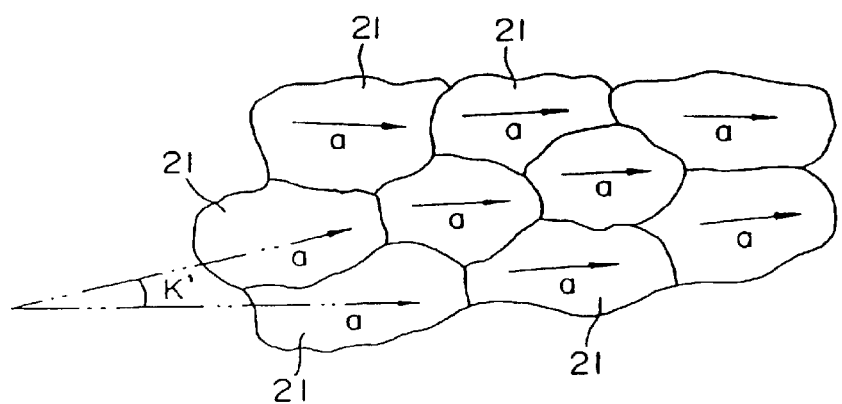
FIG. 7 is an enlarged plan view showing the crystal grains of the oxide superconducting layer shown in FIG. 6, the orientation of the crystal axes thereof, and the grain boundary inclination angle (the grain boundary misalignment angle).

Now reference will be made to FIG. 6 and FIG. 7 which show an embodiment of the oxide superconductor element according to the present invention. An oxide superconductor element 22 of this embodiment comprises a polycrystalline substrate A having the form of a sheet, a polycrystalline thin film B formed on the top surface of the polycrystalline substrate A, and an oxide superconducting layer C formed on the top surface of the polycrystalline thin film The polycrystalline substrate A and the polycrystalline thin film B are made of materials similar to those described in the preceding example, and crystal grains 20 of the polycrystalline thin film B are oriented so that the grain boundary inclination angles thereof are not larger than 30 degrees, and are preferably in a range from 25 to 30 degrees as shown in FIG. 1 and FIG. 2.

The oxide superconducting layer C is formed to cover the top surface of the polycrystalline thin film B of $Y_2O_3$ with the c-axes of crystal grains 21 being oriented perpendicular to the top surface of the polycrystalline thin film B, while the a-axes and b-axes of the crystal grains 21 are oriented in a plane parallel to the top surface of the substrate similar to the case of the polycrystalline thin film B described previously, and the grain boundary inclination angles K' between the crystal grains 21 are controlled within 30 degrees.

The oxide superconducting material which makes up the oxide superconducting layer is an oxide superconducting material of a high critical temperature having a composition represented by $Y_1Ba_2Cu_3O_{7-x}$, $Y_2Ba_4Cu_8O_x$ or $Y_3Ba_3Cu_6O_x$, a composition of $(Bi,Pb)_2Ca_2Sr_2Cu_3O_x$ or $(Bi,Pb)_2Ca_2Sr_3CU_4O_x$, or a composition of $Tl_2Ba_2Ca_2Cu_3O_x$, $Tl_1Ba_2Ca_2Cu_3O_x$ or $Tl_1Ba_2Ca_3Cu_4O_x$, but a superconductor of another oxide may also be used.

The oxide superconducting layer C is formed on the polycrystalline thin film B by a film forming process such as sputtering or laser deposition wherein the oxide superconducting layer formed on the polycrystalline thin film B also has a crystal orientation that matches the orientation of the polycrystalline thin film B of a type C rare earth oxide such as $Y_2O_3$. As a result, since the oxide superconducting layer formed on the polycrystalline thin film B is excellent in quantum coupling in the grain boundaries and hardly experiences degradation in superconducting properties in the grain boundaries, the polycrystalline substrate A has a high conductivity of electric current in the lengthwise direction and provides a sufficiently high critical current density comparable to that of an oxide superconducting layer obtained by forming on a single crystal substrate such as MgO or $SrTO_3$.

$Y_2O_3$ is better than YSZ as the material for making the polycrystalline thin film B, and the oxide superconductor element made by forming the oxide superconducting layer on the polycrystalline thin film of $Y_2O_3$ is more durable against high temperatures (700 to 800° C.) during heat treatment than the oxide superconducting layer formed on the polycrystalline thin film of YSZ, and shows a satisfactory critical current density similar to the case where the oxide superconducting layer is formed on the polycrystalline thin film of YSZ. When the film thickness increases, in particular, the critical current density experiences a smaller decrease even after being heated in a heat treatment or the like, and it becomes possible to make a superconductor having a high critical current.

The reason for the above is considered to be as follows.

First, the polycrystalline thin film of $Y_2O_3$, which has a distance between the nearest atoms closer to that of the oxide superconducting layer than the polycrystalline thin film of YSZ, is more advantageous in view of crystal matching.

Second, It has been found from research conducted by the present inventors that $BaZrO_3$ is likely to be generated in the interface between the polycrystalline thin film of YSZ and the oxide superconducting layer of $Y_1Ba_2Cu_3O_{7-X}$ by thermal diffusion KS due to a heat treatment or the like, yet the interface between an the polycrystalline thin film of $Y_2O_3$ and the oxide superconducting layer of $Y_1Ba_2Cu_3O_{7-X}$ is stable under the conditions of heating to a temperature from about 700 to 800° C., and diffusion of elements across this interface hardly occurs. Thus, the polycrystalline thin film of $Y_2O_3$ is also advantageous in this regard.

Further, YSZ undergoes a phase transition between a cubic system and an orthorhombic system depending on the temperature, while $Y_2O_3$ does not experience a phase transition and therefore has an advantage. When the strength of bonding with an oxygen atom is considered, $Y_2O_3$ has a stronger tendency to bond with oxygen than YSZ does, and this makes it possible to form the film satisfactorily under a lower partial pressure of oxygen thus placing less of a burden on the apparatus and is therefore more promising.

The apparatus for forming the oxide superconducting layer C will be described below.

Figure 8:
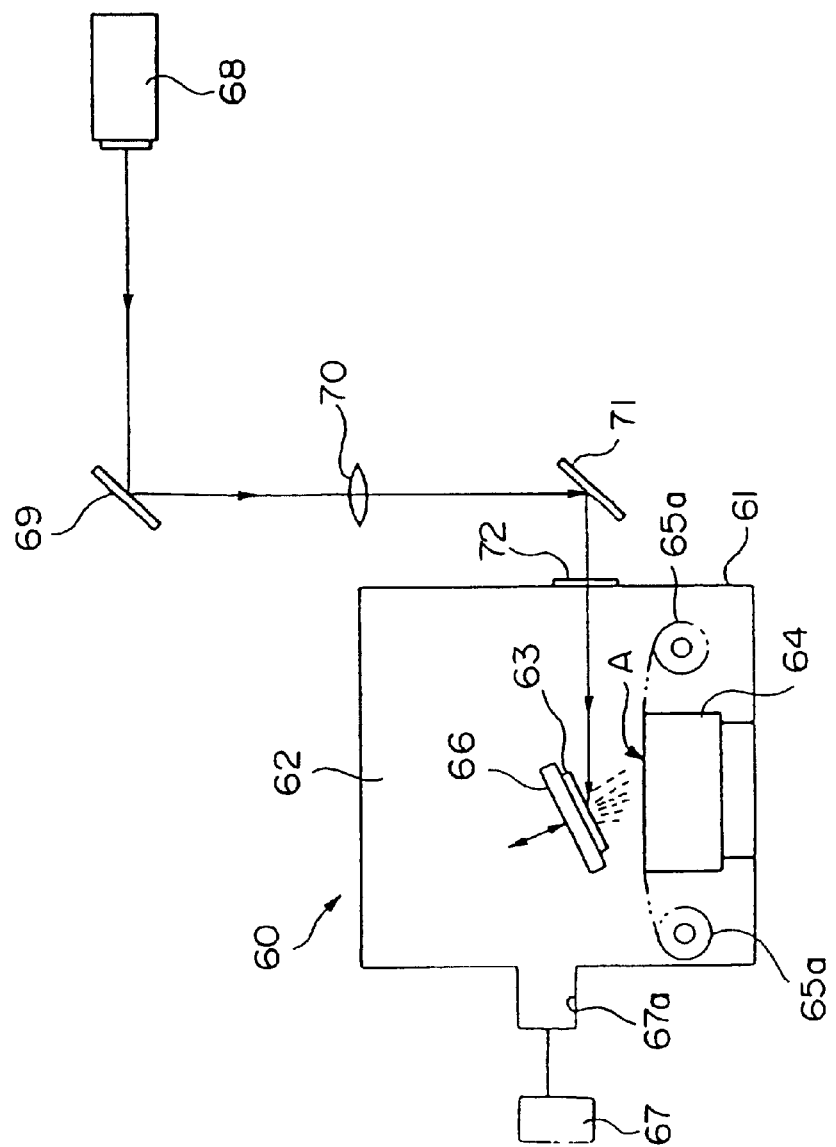
FIG. 8 is a schematic diagram showing an example of an apparatus for forming an oxide superconducting layer on the polycrystalline thin film shown in FIG. 1.

FIG. 8 is for showing an example of the apparatus for forming the oxide superconducting layer, and shows a laser deposition apparatus.

A laser deposition apparatus 60 of this example has a processing vessel 61, where a polycrystalline substrate A in the form of a tape and a target 63 can be installed in a deposition chamber 62 provided in the processing vessel 61. Specifically, a base 64 is placed at the bottom of a deposition chamber 62 so that the polycrystalline substrate A can be placed horizontally on the top surface of the base 64, and the target 63 supported by a holder 66 is disposed in an inclined state obliquely above the base 64. The polycrystalline substrate A is fed from a drum-shaped tape feeder 65a onto the base 64 and is wound by a drum-shaped tape take-up device 65a.

The processing vessel 61 is connected to a vacuum pumping system 67 via an exhaust port 67a, so that the inner pressure can be decreased to a predetermined level.

The target 63 is a sheet made of a sintered composite oxide or an oxide superconducting material having the same or a similar composition as the oxide superconducting layer C to be formed, or includes a high concentration of a component which is likely to escape during film formation.

The base 64 incorporates a heater to heat the polycrystalline substrate A to a desired temperature.

Located to the side of the processing chamber 61 are a laser device 68, a first reflector 69, a condenser lens 70, and a second reflector 71, so that a laser beam emitted by the laser device 68 can be directed to and incident on the target 63 via a transparent window 72 provided in a side wall of the processing vessel 61. The laser device 68 may be of any type including a YAG laser, a $CO_2$ laser, and an excimer laser as long as it can knock particles off of the target 63.

Next, an operation to form the oxide superconducting layer C on the polycrystalline thin film B will be described.

The oxide superconducting layer is formed on the polycrystalline thin film B after forming the polycrystalline thin film B of $Y_2O_3$ on the polycrystalline substrate A. In this embodiment, the laser deposition apparatus 60 shown in FIG. 8 is used to form the oxide superconducting layer on the polycrystalline thin film B.

The polycrystalline substrate A having the polycrystalline thin film B formed thereon is placed on the base 64 of the laser deposition apparatus 60 shown in FIG. 8, and the deposition chamber 62 is evacuated by a vacuum pump. Here, oxygen gas may be introduced into the deposition chamber 62 to create an oxygen atmosphere in the deposition chamber 62. The heater incorporated in the base 64 is energized to heat the polycrystalline substrate A to a desired temperature.

Next, the, target 63 in the deposition chamber 62 is irradiated with the laser beam emitted by the laser device 68. This causes the material that makes up the target to be knocked off of the target 63 or vaporized and deposited on the polycrystalline thin film B. Since the polycrystalline thin film B of $Y_2O_3$, whereon the particles are deposited, is in a state such that the c-axis orientation is achieved while the a-axis and b-axis are also oriented, epitaxial growth of the crystals is achieved so that the c-axes, a-axes and b-axes of the crystals of the oxide superconducting layer C formed on the polycrystalline thin film B match the polycrystalline thin film B. As a result, an oxide superconducting layer C having a satisfactory crystal orientation can be obtained.

The oxide superconducting layer C formed on the polycrystalline thin film B is in a polycrystalline state, although in the individual crystal grains of the oxide superconducting layer C, the c-axis, in which electric conductivity is high, is oriented in the direction of the thickness of the polycrystalline substrate A, and the a-axes or b-axes of different grains are oriented in the longitudinal direction of the polycrystalline substrate A. Since the oxide superconducting layer thus formed has good quantum coupling characteristics in the grain boundaries and experiences less degradation in superconducting properties in the grain boundaries, the electric conductivity is high in the planer direction of the polycrystalline substrate A, and the critical current density is high. In order to stabilize the crystal orientation and film quality of the superconducting layer C, it is preferable to apply a heat treatment of heating to a temperature of 700 to 800° C. for the required period of time and then cooling.

Embodiments

With the polycrystalline thin film producing apparatus which has the constitution shown in FIG. 4, the deposition vessel was evacuated by means of a rotary pump and a cryopump to decrease the pressure to $3.0 \times 10^{-4}$ Torr (399.9×

$10^{-4}$ Pa). A tape of Hastelloy C276 measuring 10 mm in width, 0.5 mm in thickness, and 100 cm in length, which was polished to mirror quality finish, was used as the substrate. The target was made of $Y_2O_3$. Sputtering conditions were set as follows: a sputtering voltage of 1000 V, a sputtering current of 100 mA, the incident angle of the $Kr^+$ ion beam generated by the ion source being 55 degrees from the normal direction of the film forming surface of the substrate, the travel distance of the ion beam being 40 cm, an ion source assist voltage of 150 eV, a current density of the ion source of 100 $\mu$Å/cm$^2$, the substrate tape temperature being 300° C., and the oxygen supplied into the atmosphere being $1\times10^{-4}$ Torr ($133.3\times10^{-4}$ Pa); thereby the particles of the target were deposited on the substrate and, at the same time, the polycrystalline thin film of $Y_2O_3$ was formed to a thickness of 1.0 $\mu$m by irradiating with the ion beam.

Figure 9:
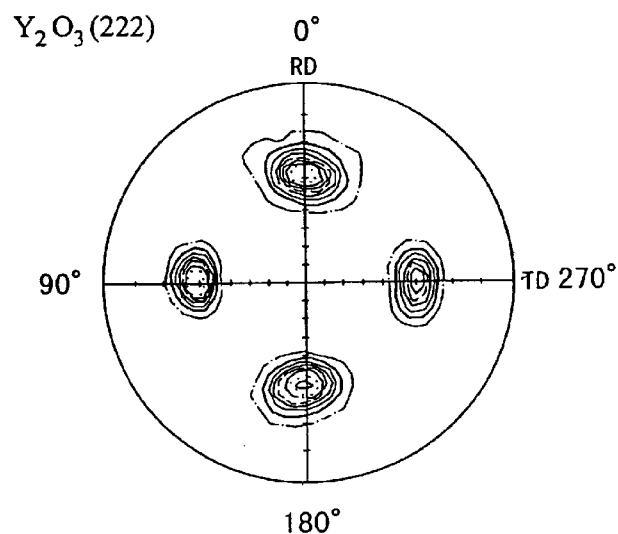
FIG. 9 is a polar plot of a polycrystalline thin film of $Y_2O_3$ produced in an embodiment.

Based on X-ray diffraction analysis of the polycrystalline thin film of $Y_2O_3$ thus obtained by a θ–2θ method using the CuK α line, a polar plot with reference to the <200> direction of $Y_2O_3$, as shown in FIG. 9, was drawn. From the polar plot shown in FIG. 9, it can be seen that the polycrystalline thin film of $Y_2O_3$ has a satisfactory crystal orientation. A grain boundary inclination angle of 27 degrees was determined for the polycrystalline thin film of $Y_2O_3$ from the polar plot shown in FIG. 9.

Next, the film forming conditions for the polycrystalline thin film of $Y_2O_3$ were checked by testing the orientation of the obtained polycrystalline thin film of $Y_2O_3$ by changing the $Ar^+$ ion beam energy and the substrate temperature, and the results are as described below.

Figure 10:
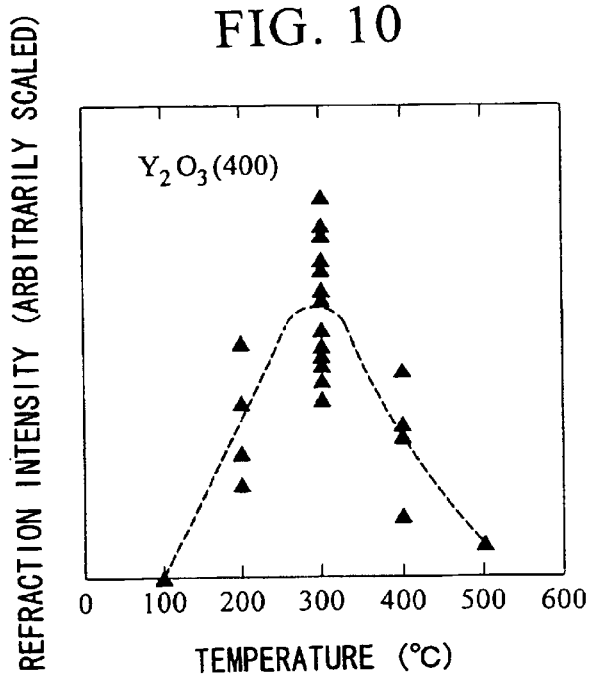
FIG. 10 shows the relationship between the substrate temperature and the $Y_2O_3$ (400) peak in the polycrystalline thin film of $Y_2O_3$ produced in the embodiment.

The measurements of the height of the (400) peak of the polycrystalline thin film of $Y_2O_3$ at different substrate temperatures are shown in FIG. 10.

A greater height of the (400) peak means a better orientation of the c-axis, namely the vertical axis of the polycrystalline thin film of $Y_2O_3$. Accordingly, it can be seen that it is necessary to set the temperature of the substrate in a range from 200 to 400° C., preferably in a range from 250 to 350° C., and most preferably at 300° C., in order to ensure the vertical axis orientation of the polycrystalline thin film of $Y_2O_3$.

Figure 11:
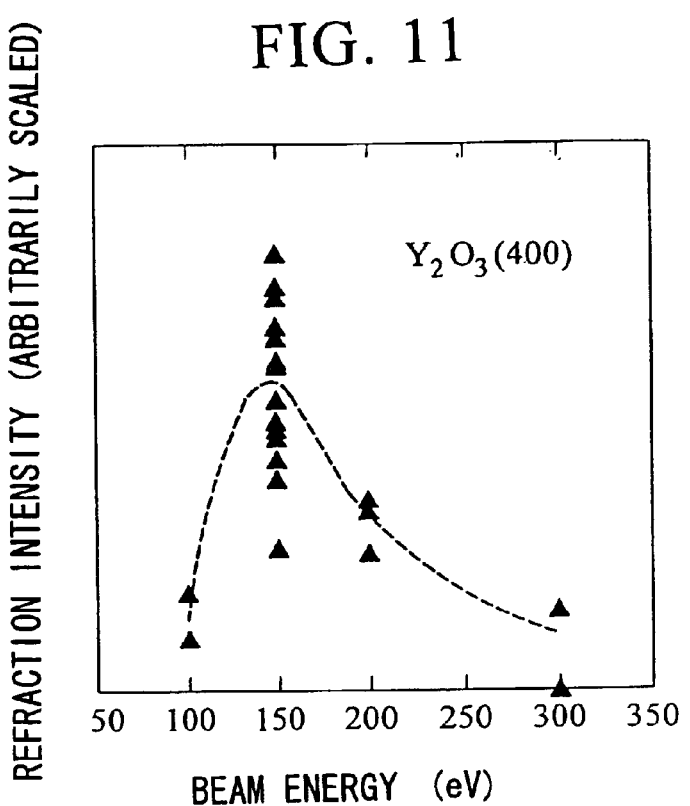
FIG. 11 shows the relationship between the ion beam energy and the $Y_2O_3$ (400) peak in the polycrystalline thin film of $Y_2O_3$ produced in the embodiment.

The measurements of the height of the (400) peak of the polycrystalline thin film of $Y_2O_3$ at different ion beam energy values are shown in FIG. 11.

Figure 12:
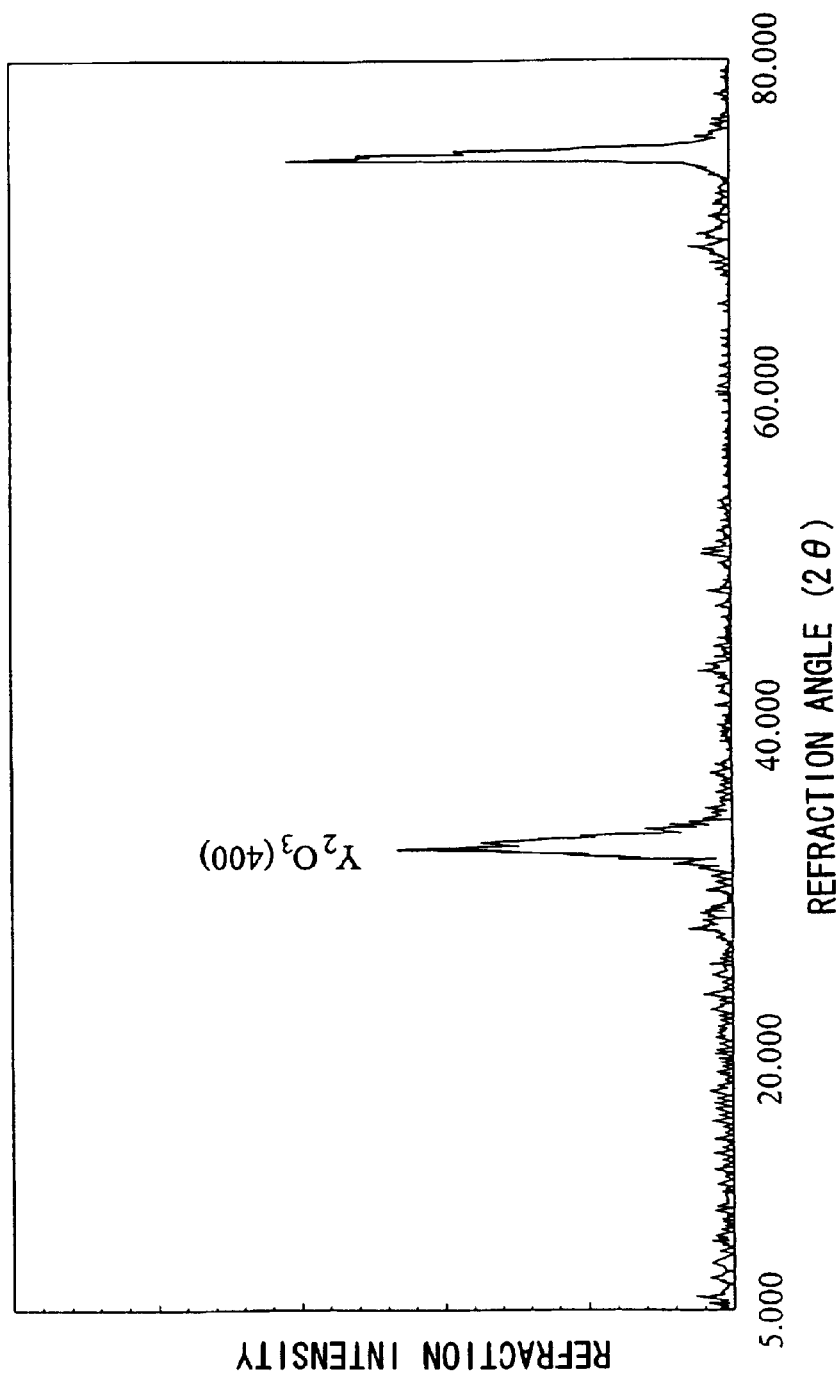
FIG. 12 is an X-ray diffraction spectrograph showing the (400) peak in the polycrystalline thin film of $Y_2O_3$ obtained in the embodiment.

FIG. 11 shows that the vertical axis orientation of the polycrystalline thin film of $Y_2O_3$ can be ensured by setting the ion beam energy in a range from 100 to 300 eV, and preferably setting in a range from 125 to 175 eV, and most preferably at 150 eV. The diagram of the (400) peak shown in FIG. 11 was prepared from the (400) peak values measured on different samples of $Y_2O_3$, as shown in FIG. 12.

Polar plots were prepared from various samples of polycrystalline thin films of $Y_2O_3$ formed under different conditions of ion beam energy and substrate temperature. Table 1 shows the grain boundary inclination angles determined from the polar plots of different film forming conditions.

TABLE 1

| $Ar^+$ energy (eV) Substrate temperature | 125 | 135 | 150 | 175 | 200 | 300 |
|---|---|---|---|---|---|---|
| 500° C. |  |  | X |  | X |  |
| 400° C. |  |  | X |  |  |  |
| 350° C. |  |  | 30° |  |  |  |
| 300° C. | X | 30° | 26° | 30° | X |  |

TABLE 1-continued

| $Ar^+$ energy (eV) Substrate temperature | 125 | 135 | 150 | 175 | 200 | 300 |
|---|---|---|---|---|---|---|
| 250° C. |  |  | 30° |  |  |  |
| 200° C. |  |  | X |  | X |  |
| 100° C. |  |  | X |  | X |  |

In Table 1, mark X indicates that the pattern of the polar plot spread rather than converged as shown in FIG. 9, and the grain, boundary inclination angle could not be measured. From the results shown in Table 1, it was found that, in order to obtain the polycrystalline thin film of $Y_2O_3$ with grain boundary inclination angles within 30 degrees, it is necessary to set the ion beam energy of $Ar^+$ in a range from 135 eV to 175 eV and to set the substrate temperature in a range from 250 to 350° C.

Figure 13:
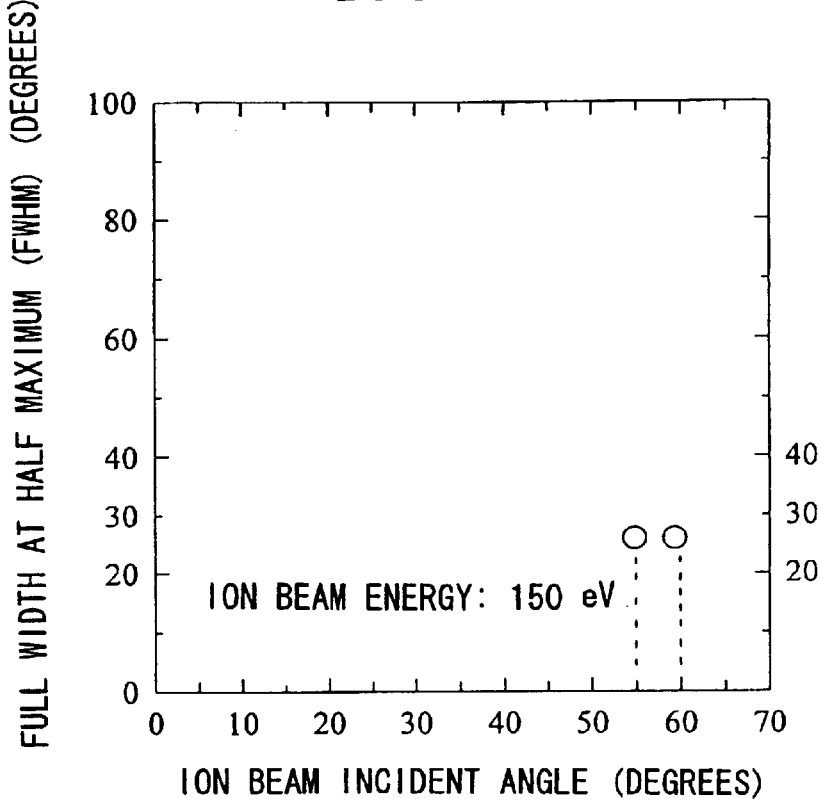
FIG. 13 shows the relationship between the incident angle of the ion beam and the crystal orientation during the production of the polycrystalline thin film of $Y_2O_3$ produced in the embodiment.
Figure 14:
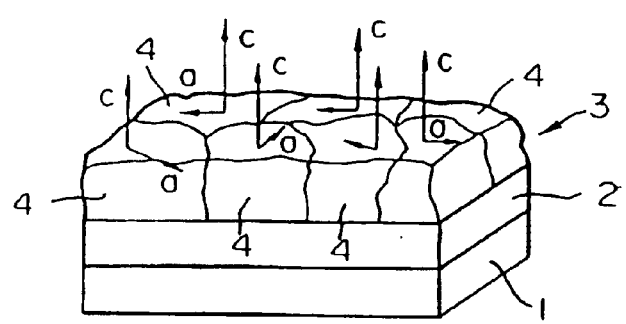
FIG. 14 is a schematic diagram showing a polycrystalline thin film produced by a prior art apparatus.
Figure 15:
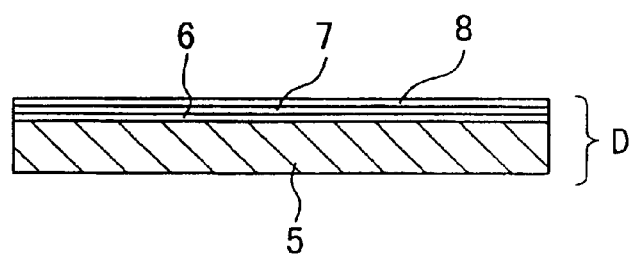
FIG. 15 is a sectional view showing an example of an oxide superconductor element of the prior art.

FIG. 13 shows the relationship between the incident angle of the ion beam and the crystal orientation of the polycrystall thin film when the polycrystalline thin film of $Y_2O_3$ is produced while changing the incident angle of the ion beam with the other conditions being the same as those described above.

It is clear that a better crystal orientation can be achieved when the incident angle of the ion beam is controlled within, a range from 50 to 60 degrees. In samples made under conditions outside of this range, no area where the pattern of the polar plot converges could be found, and the full width at half maximum could not be measured.

Next, the oxide superconducting layer was formed on the polycrystalline thin film of $Y_2O_3$ by using a laser deposition apparatus having the constitution shown in FIG. 8. A target made of an oxide superconducting material having a composition of $Y_1Ba_2Cu_3O_{7-X}$ was used. The deposition chamber was evacuated to decrease the inner pressure to $1\times10^{-6}$ Torr ($133.3\times10^{-6}$ Pa), and laser deposition was carried out at room temperature. An ArF laser oscillating at a wavelength of 193 nm was used for evaporating the target. Then a heat treatment was applied in an oxygen atmosphere at 400° C. for 60 minutes. An oxide superconductor element measuring 1.0 cm in width and 100 cm in length was obtained.

| Film thickness ($\mu$m) | 1 |
|---|---|
| Jc (A/cm$^2$) | $4.0 \times 10^5$ |
| Ic (A) | 40 |

What is claimed is:

1. A polycrystalline thin film consisting mainly of oxide crystal grains which have a crystal structure of a type C rare earth oxide represented by one of the formulas $Y_2O_3$, $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$ formed on a film forming surface of a polycrystalline substrate, wherein grain boundary inclination angles between corresponding crystal axes of different crystal grains in the polycrystalline thin film along a plane parallel to the film forming surface of the polycrystalline substrate are controlled within 30 degrees.

2. A polycrystalline thin film as claimed in claim 1, wherein said polycrystalline substrate is a heat resistant metal tape made of an Ni alloy and said crystal grains are made of $Y_2O_3$.

3. A method of producing a polycrystalline thin film consisting of oxide crystal grains which have a crystal structure of a type C rare earth oxide represented by one of the formulas $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$ being on a film forming surface of a polycrystalline substrate, with grain boundary inclination angles between corresponding crystal axes of different crystal grains along a plane parallel to the film forming surface of the polycrystalline substrate being controlled within 30 degrees, wherein the polycrystalline substrate is set to a temperature in a range from 200 to 400° C. and an ion beam of $Kr^+$ or $Xe^+$ ions or a combined beam of these ions is generated from an ion source with the energy of the ion beam being set in a range from 100 eV to 300 eV, while an incident angle of the ion beam irradiating the film forming surface of the polycrystalline substrate is set in a range from 50 to 60 degrees from the normal direction of the film forming surface of the polycrystalline substrate when depositing particles generated from a target, which is made of the same elements as those of the polycrystalline thin film, onto the polycrystalline substrate.

4. An oxide superconductor element comprising a polycrystalline substrate, a polycrystalline thin film formed on a film forming surface of the polycrystalline substrate, and an oxide superconducting layer formed on the polycrystalline thin film, wherein the polycrystalline thin film consists of oxide crystal grains which have a crystal structure of a type C rare earth oxide represented by one of the formulas $Y_2O_3$, $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$, and grain boundary inclination angles between corresponding crystal axes of different crystal grains along a plane parallel to the film forming surface of the polycrystalline substrate are controlled within 30 degrees.

5. An oxide superconductor element as claimed in claim 4, wherein said polycrystalline substrate is a metal tape.

6. A method of producing an oxide superconductor element comprising a polycrystalline substrate, a polycrystalline thin film formed on a film forming surface of the polycrystalline substrate, and any oxide superconducting layer formed on the polycrystalline thin film, with the polycrystalline thin film consisting of oxide crystal grains which have a crystal structure of a type C rare earth oxide represented by one of the formulas $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$, and grain boundary inclination angles between corresponding crystal axes of different crystal grains along a plane parallel to a film forming surface of the polycrystalline substrate being controlled within 30 degrees, wherein the polycrystalline substrate is set to a temperature in a range from 200 to 400° C. and an ion beam of $Kr^+$ or $Xe^+$ ions or a combined beam of these ions is generated from an ion source with the energy of the ion beam being set in a range from 100 eV to 300 eV, while an incident angle of the ion beam irradiating the film forming surface of the polycrystalline substrate is set in a range from 50 to 60 degrees from the normal direction of the film forming surface of the polycrystalline substrate when depositing particles generated from a target made of the same elements as those of the polycrystalline thin film onto the polycrystalline substrate, and then the oxide superconducting layer is formed on the polycrystalline thin film.

7. A method of producing a polycrystalline thin film consisting of oxide crystal grains which have a crystal structure of a type C rare earth oxide represented by the formula $Y_2O_3$, being on a film forming surface of a polycrystalline substrate, with grain boundary inclination angles between corresponding crystal axes of different crystal grains along a plane parallel to the film forming surface of the polycrystalline substrate being controlled within 30 degrees, wherein the polycrystalline substrate is set to a temperature in a range from 250 to 350° C. and an ion beam of $Kr^+$ or $Xe^+$ ions or a combined beam of these ions is generated from an ion source with the energy of the ion beam being set in a range from 135 eV to 175 eV, while an incident angle of the ion beam irradiating the film forming surface of the polycrystalline substrate is set in a range from 50 to 60 degrees from the normal direction of the film forming surface of the polycrystalline substrate when depositing particles generated from a target, which is made of the same elements as those of the polycrystalline thin film, onto the polycrystalline substrate.

8. A method of producing an oxide superconductor element comprising a polycrystalline substrate, a polycrystalline thin film formed on a film forming surface of the polycrystalline substrate, and any oxide superconducting layer formed on the polycrystalline thin film, with the polycrystalline thin film consisting of oxide crystal grains which have a crystal structure of a type C rare earth oxide represented by the formula $Y_2O_3$, and grain boundary inclination angles between corresponding crystal axes of different crystal grains along a plane parallel to a film forming surface of the polycrystalline substrate being controlled within 30 degrees, wherein the polycrystalline substrate is set to a temperature in a range from 250 to 350° C. and an ion beam of $Kr^+$ or $Xe^+$ ions or a combined beam of these ions is generated from an ion source with the energy of the ion beam being set in a range from 135 eV to 175 eV, while an incident angle of the ion beam irradiating the film forming surface of the polycrystalline substrate is set in a range from 50 to 60 degrees from the normal direction of the film forming surface of the polycrystalline substrate when depositing particles generated from a target made of the same elements as those of the polycrystalline thin film onto the polycrystalline substrate, and then the oxide superconducting layer is formed on the polycrystalline thin film.

* * * * *

UNITED STATES PATENT AND TRADEMARK OFFICE
CERTIFICATE OF CORRECTION

PATENT NO.   : 6,716,796 B1
DATED        : April 6, 2004
INVENTOR(S)  : Yasuhiro Iijima, Mariko Kimura and Takashi Saito It is certified that error appears in the above-identified patent and that said Letters Patent is hereby corrected as shown below:

Title page,
Item [73], should read:
-- [73] Assignees: Fujikura Ltd., Tokyo (JP); International Superconductivity Technology Center, The Juridical Foundation, Tokyo (JP) --.

Signed and Sealed this

Eleventh Day of April, 2006

JON W. DUDAS
*Director of the United States Patent and Trademark Office*